US011013137B2

(12) United States Patent
Chen et al.

(10) Patent No.: US 11,013,137 B2
(45) Date of Patent: May 18, 2021

(54) SERVER CAPABLE OF ACCESSING AND ROTATING STORAGE DEVICES ACCOMMODATED THEREIN

(71) Applicant: SUPER MICRO COMPUTER, INC., San Jose, CA (US)

(72) Inventors: Richard S. Chen, San Jose, CA (US); Chaoching Wu, San Jose, CA (US)

(73) Assignee: SUPER MICRO COMPUTER, INC., San Jose, CA (US)

( * ) Notice: Subject to any disclaimer, the term of this patent is extended or adjusted under 35 U.S.C. 154(b) by 0 days.

(21) Appl. No.: 15/960,346

(22) Filed: Apr. 23, 2018

(65) Prior Publication Data

US 2018/0310429 A1    Oct. 25, 2018

Related U.S. Application Data

(63) Continuation of application No. 15/232,638, filed on Aug. 9, 2016, now Pat. No. 9,955,606, which is a continuation of application No. 15/000,768, filed on Jan. 19, 2016, now Pat. No. 9,795,050, which is a continuation-in-part of application No. 14/552,647, filed on Nov. 25, 2014, now Pat. No. 9,468,127.

(51) Int. Cl.
| H05K 7/00 | (2006.01) |
| H05K 7/14 | (2006.01) |
| G11B 33/14 | (2006.01) |
| G11B 33/12 | (2006.01) |
| H05K 7/20 | (2006.01) |

(52) U.S. Cl.
CPC ......... *H05K 7/1487* (2013.01); *G11B 33/128* (2013.01); *G11B 33/142* (2013.01); *H05K 7/20727* (2013.01)

(58) Field of Classification Search
None
See application file for complete search history.

(56) References Cited

U.S. PATENT DOCUMENTS

| 5,515,515 | A  | 5/1996  | Kennedy et al. |
| 5,995,364 | A  | 11/1999 | McAnally et al. |
| 6,530,551 | B2 | 3/2003  | Gan |
| 6,580,603 | B1 | 6/2003  | Resnick |
| 6,611,424 | B2 | 8/2003  | Huang |
| 6,769,540 | B2 | 8/2004  | Hsieh et al. |

(Continued)

*Primary Examiner* — Anthony Q Edwards
*Assistant Examiner* — Rashen E Morrison
(74) *Attorney, Agent, or Firm* — Artegis Law Group, LLP

(57) ABSTRACT

A server capable of rotating and accessing storage devices accommodated therein includes a server chassis, a motherboard, a power supply module, two racks, and a system cooling module. The server chassis includes two side plates and an accommodating space between the two side plates. The power supply module is disposed in the accommodating space and arranged corresponding to the motherboard. The racks are arranged parallel to each other and detachably connected to the server chassis. A pivot structure and a handle for operating the rack are disposed at the rack near the motherboard. The rack is rotatable with respect to the server chassis by means of the pivot structure. The system cooling module is disposed adjacent to the rack. At least one cord passage is provided between the system cooling module and each of the side plates.

19 Claims, 13 Drawing Sheets

(56) References Cited

U.S. PATENT DOCUMENTS

| | | | |
|---|---|---|---|
| 6,788,542 B2* | 9/2004 | Rumney | H05K 7/1421 361/724 |
| 6,788,544 B1 | 9/2004 | Barsun et al. | |
| 6,795,309 B2 | 9/2004 | Hartung et al. | |
| 6,826,055 B2 | 11/2004 | Mease et al. | |
| 6,922,336 B2 | 7/2005 | Barsun et al. | |
| 9,179,573 B1 | 11/2015 | Lundquist et al. | |
| 9,265,173 B1* | 2/2016 | Jhang | G06F 1/187 |
| 9,497,881 B2 | 11/2016 | Chen et al. | |
| 10,045,458 B2* | 8/2018 | Yu | H05K 5/023 |
| 10,104,803 B1* | 10/2018 | Lin | H05K 7/18 |
| 10,212,840 B2* | 2/2019 | Kuan | H05K 7/1487 |
| 2003/0147220 A1* | 8/2003 | Fairchild | G06F 1/187 361/726 |
| 2003/0202321 A1* | 10/2003 | Lin | G06F 1/184 361/679.33 |
| 2004/0184243 A1* | 9/2004 | Mease | G06F 1/184 361/725 |
| 2005/0157461 A1* | 7/2005 | Cauthron | H05K 7/1488 361/724 |
| 2005/0257232 A1* | 11/2005 | Hidaka | H05K 7/1487 720/654 |
| 2005/0286235 A1 | 12/2005 | Randall et al. | |
| 2008/0130219 A1 | 6/2008 | Rabinovitz | |
| 2008/0192431 A1 | 8/2008 | Bechtolsheim | |
| 2010/0007252 A1 | 1/2010 | Liu | |
| 2010/0203931 A1* | 8/2010 | Hynecek | A45C 11/00 455/575.8 |
| 2011/0248612 A1 | 10/2011 | Peng et al. | |
| 2011/0279973 A1 | 11/2011 | Terwilliger et al. | |
| 2012/0020016 A1 | 1/2012 | Cheng | |
| 2012/0069514 A1 | 3/2012 | Ross | |
| 2012/0134099 A1 | 5/2012 | Zhang | |
| 2012/0170175 A1 | 7/2012 | Silberbauer et al. | |
| 2012/0201003 A1 | 8/2012 | Shimasaki et al. | |
| 2013/0342990 A1* | 12/2013 | Jau | H05K 7/1487 361/679.39 |
| 2014/0021836 A1 | 1/2014 | Hou et al. | |
| 2015/0062798 A1 | 3/2015 | Kannler et al. | |
| 2015/0077923 A1 | 3/2015 | Rauline | |
| 2015/0342080 A1* | 11/2015 | Chen | G11B 33/128 361/679.31 |
| 2016/0135322 A1* | 5/2016 | Chen | G11B 33/128 361/679.46 |
| 2018/0157295 A1* | 6/2018 | Zhu | G06F 1/187 |

* cited by examiner

SERVER CAPABLE OF ACCESSING AND ROTATING STORAGE DEVICES ACCOMMODATED THEREIN

CROSS-REFERENCE TO RELATED APPLICATION

This application is a continuation of the co-pending U.S. patent application titled, "SERVER CAPABLE OF ACCESSING AND ROTATING STORAGE DEVICES ACCOMMODATED THEREIN," filed on Aug. 9, 2016 and having application Ser. No. 15/232,638, which is a continuation of the co-pending U.S. patent application titled, "SERVER CAPABLE OF ACCESSING AND ROTATING STORAGE DEVICES ACCOMMODATED THEREIN," filed on Jan. 19, 2016 and having application Ser. No. 15/000,768, which is a continuation-in-part of U.S. patent application titled, "SERVER CHASSIS CAPABLE OF ACCESSING AND ROTATING STORAGE DEVICES ACCOMMODATED THEREIN," filed on Nov. 25, 2014 and having application Ser. No. 14/552,647, which claims priority to Taiwan patent application having Application Ni 103208967, filed May 22, 2014. The subject matter of these related applications is hereby incorporated herein by reference.

TECHNICAL FIELD

The present invention relates to a server, particularly to a server capable of accessing and rotating the storage devices accommodated therein, thereby allowing a maximum possible number of the storage devices to be accommodated in the server.

BACKGROUND

The conventional server system mainly has electronic devices such as the motherboards, the storage devices, and the power supply installed in a casing. The interior space of the casing is usually divided into a plurality of insertion spaces which are provided to accommodate multiple storage devices arranged in an array. The most common storage device includes a hard disk drive (HDD) or a solid state drive (SSD), etc. However, due to the demand of calculation ability and massive data storage, the server needs to accommodate more storage devices in a very limited casing space. Therefore, the structure and configuration of the casing also needs to be changed correspondingly.

In order to increase the quantity of the storage devices, the casing of the conventional server is provided with racks arranged parallelly to receive the storage devices. Since it is not easy to pull out or replace and service the storage devices in rack near the motherboard, a simple flexible element is fixed, by screws, to a side wall of the rack, so that the rack is rotatable with respect to the casing. In the conventional server, the storage devices are stacked horizontally in the insertion spaces of the rack, and the quantity of the storage devices is too limited to satisfy the demand. If increasing the quantity of the storage devices, the flexible element on the rack is not able to provide sufficient torque to support the rack and allow its rotation to a certain angle.

Accordingly, the inventor made various studies to improve and solve the above-mentioned problem, on the basis of which the present invention is accomplished.

SUMMARY

It is an object of the present invention to provide a server capable of rotating and accessing the storage devices accommodated therein, which allows a maximum possible number of the storage devices to be accommodated in the server, and provides a high torque.

It is another object of the present invention to provide a server capable of rotating and accessing the storage devices accommodated therein, whereby a rack can be operated and positioned easily and conveniently.

Accordingly, the present invention provides a server capable of rotating and accessing storage devices accommodated therein, comprising a server chassis, a motherboard, a power supply module, two racks, and a system cooling module. The server chassis includes two side plates and an accommodating space between the two side plates. The motherboard is disposed in the accommodating space, the power supply module is disposed in the accommodating space and arranged corresponding to the motherboard, and the power supply module is electrically connected to the motherboard. The racks are arranged parallel to each other and detachably connected to the server chassis. Each of the racks includes a plurality of insertion spaces, the storage devices are vertically accommodated in the insertion spaces respectively. A pivot structure and a handle for operating the rack are disposed at one side of the rack near the motherboard. The rack is rotatable with respect to the server chassis by means of the pivot structure. The system cooling module is disposed in the accommodating space and electrically connected to the motherboard. The system cooling module is disposed adjacent to one side of the rack. A first cord passage is provided between the rack and each of the side plates, a second cord passage is provided between the system cooling module and each of the side plates, and the storage devices disposed in the racks are electrically connected to the motherboard via the first cord passage and the second cord passage.

The present invention further has the following advantages. The system cooling module includes an increased number of fans, and the fans are disposed centralized in the center of the server chassis by means of the system cooling module, so the assembly can be accomplished easily and conveniently, and the system airflow can be focused on the storage devices in the rack to expel the heat generated by the storage devices to enhance heat dissipation effectively. Furthermore, the racks and the system cooling module each define a cord passage between them and the two side plates of the server chassis, so the storage devices in the racks can be electrically connected to the motherboard via the cord passage, thereby achieving ideal and convenient wiring.

BRIEF DESCRIPTION OF THE DRAWINGS

The disclosure will become more fully understood from the detailed description, and the drawings given herein below are for illustration only, and thus does not limit the disclosure, wherein.

DETAILED DESCRIPTION

Figure 1:
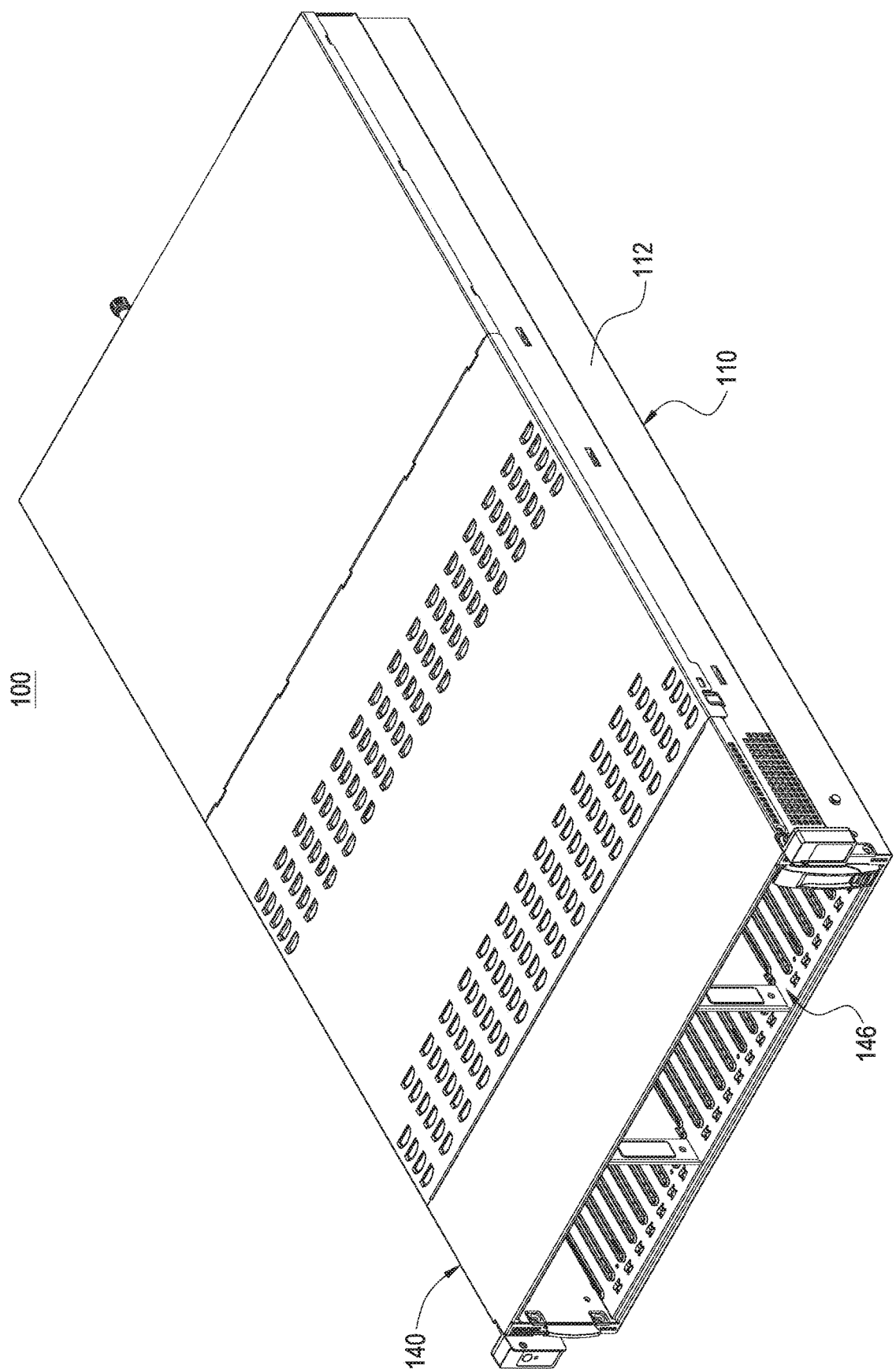
FIG. 1 is a perspective view of the present invention, illustrating a server capable of rotating and accessing storage devices accommodated therein.

Detailed descriptions and technical contents of the present invention are illustrated below in conjunction with the accompany drawings. However, it is to be understood that the descriptions and the accompany drawings disclosed herein are merely illustrative and exemplary and not intended to limit the scope of the present invention.

Referring to FIGS. 1 to 5, the present invention provides a server 100 capable of rotating and accessing storage devices accommodated therein, comprising a server chassis 110, a motherboard 120, a power supply module 130, two racks 140, and a system cooling module 200. The storage device in the present embodiment is preferably a hard disk drive (HDD) or a solid state drive (SSD). However, in other embodiments, the storage device can also be an optical disk driver, a flash memory, or a suitable mass storage device.

The server chassis 110 includes two side plates 112, a bottom plate 114 connected to the two side plates 112, and an accommodating space 116 among the two side plates 112 and the bottom plate 114. The motherboard 120 is disposed in the accommodating space 116. The power supply module 130 is disposed in the accommodating space 116 and arranged corresponding to the motherboard 120. The power supply module 130 is electrically connected to the motherboard 120.

Figure 2:
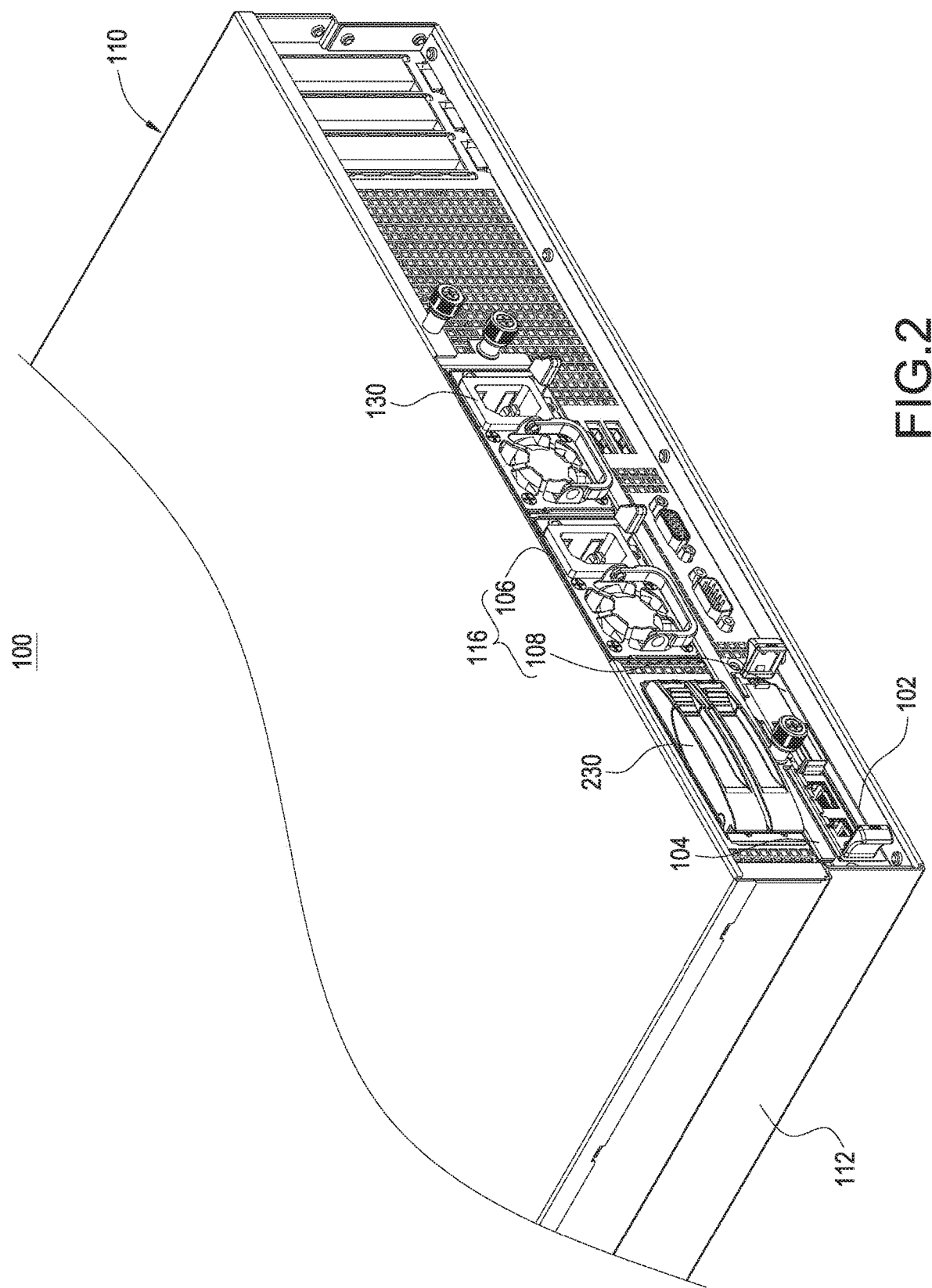
FIG. 2 is a partial perspective view of the present invention, viewed at another viewing angle, illustrating the server capable of rotating and accessing the storage devices accommodated therein.
Figure 4:
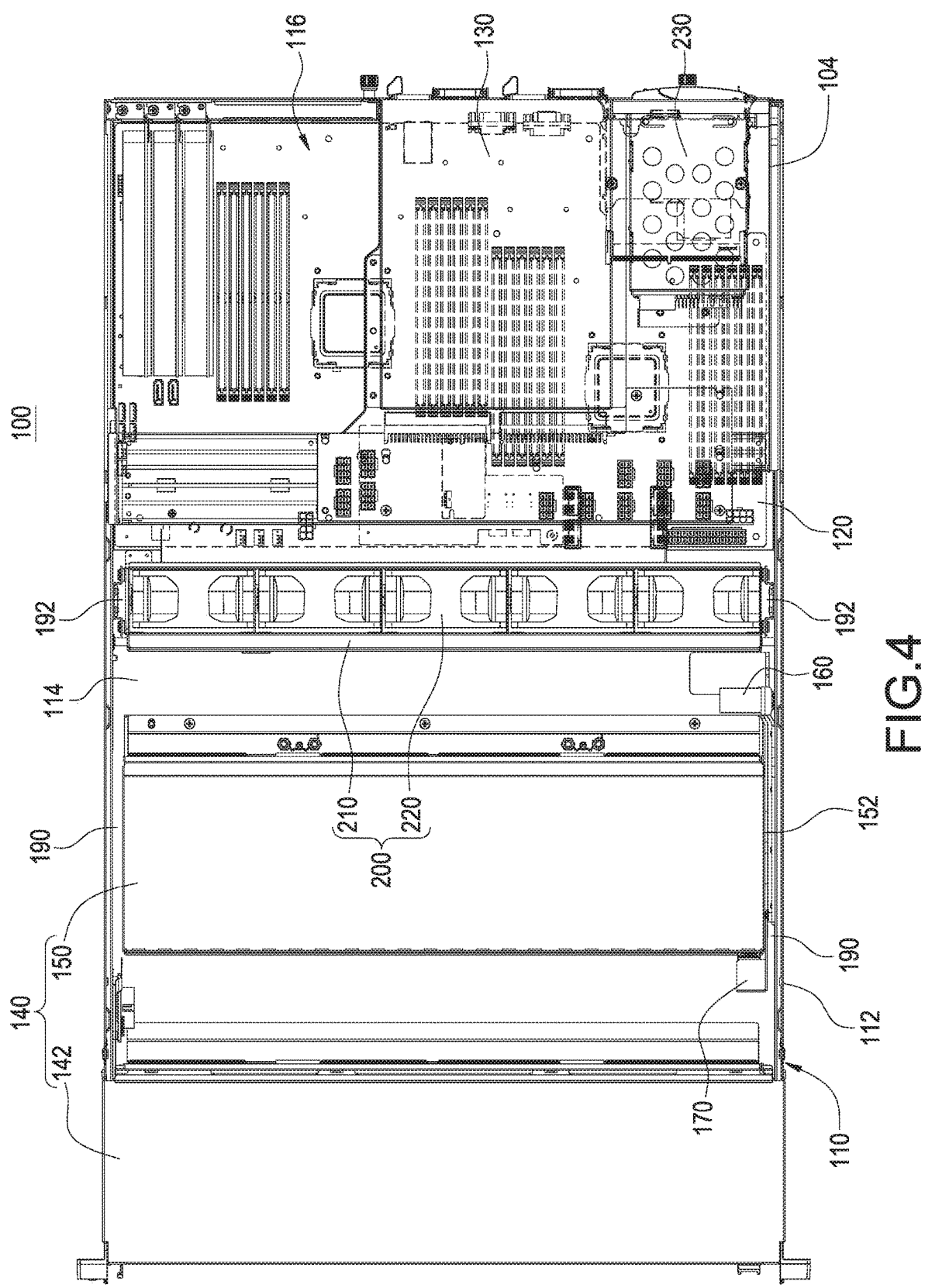
FIG. 4 is a top view of FIG. 3.
Figure 5:
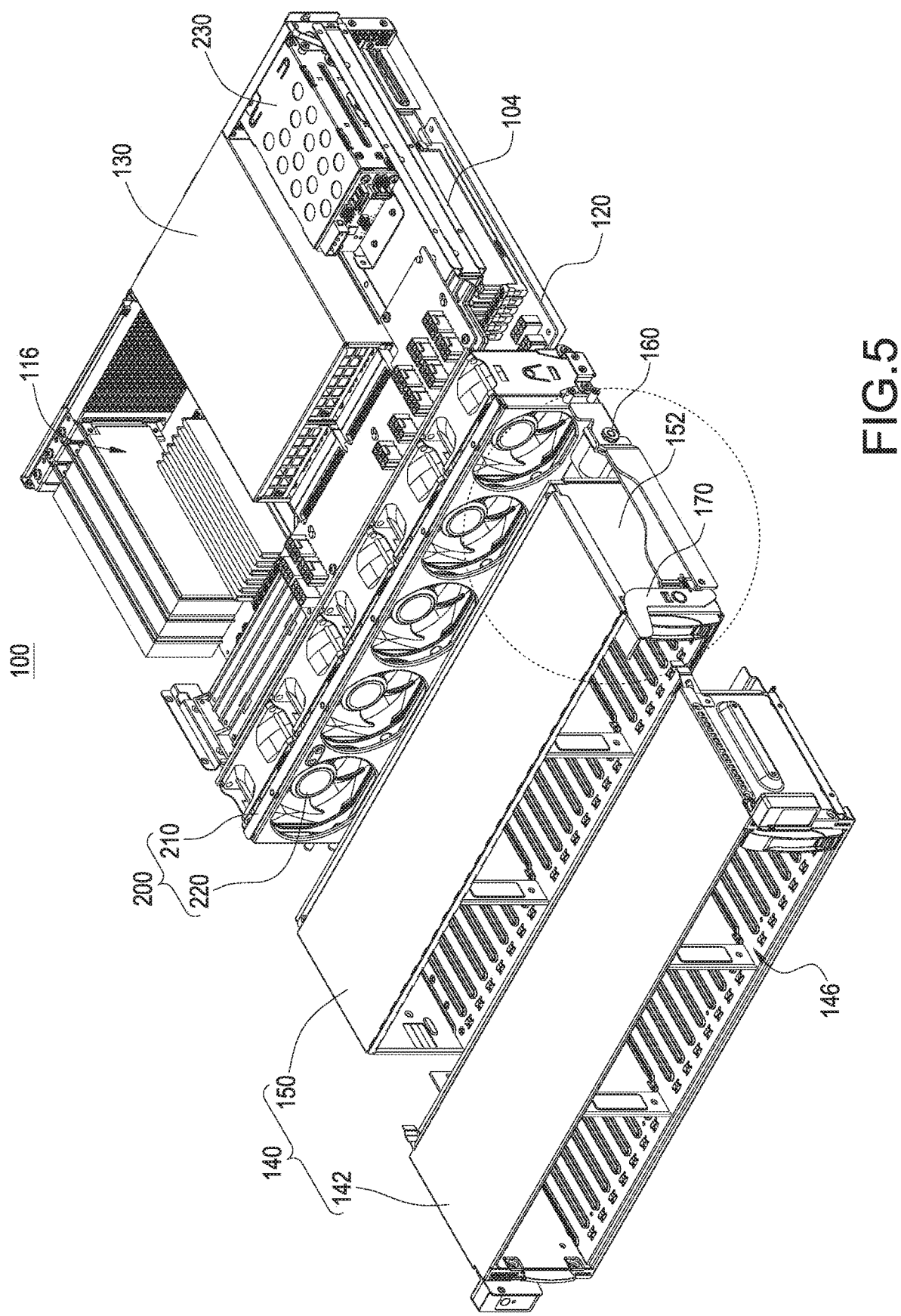
FIG. 5 is a perspective view of the present invention, illustrating the server with a server chassis omitted.

As shown in FIGS. 2, 4 and 5, the present embodiment further includes an opening 102 and an electronic device 230 disposed corresponding to the opening 102. The opening 102 communicates with the accommodating space 116. The electronic device 230 is electrically connected to the motherboard 120. In the present embodiment, the electronic device 230 is preferably a storage device, or more preferably two storage devices in order to increase the quantity of the storage devices. The server chassis 110 further includes a partition plate 104 disposed corresponding to the motherboard 120, the partition plate 104 dividing the accommodating space 116 into a first layer 106 and a second layer 108. The electronic device 230 and the power supply module 130 are preferably disposed in the first layer 106, and the motherboard 120 with a plurality of I/O ports is selectively disposed in the second layer 108 depending on the user's requirement.

The racks 140 are arranged parallel to each other and detachably connected to the server chassis 110. Each of the racks 140 includes a plurality of insertion spaces 146. The storage devices (not illustrated) are vertically accommodated in the insertion spaces 146 respectively. In other words, the storage devices are installed in the respective insertion spaces 146 of the racks 140, in a direction parallel to each of the side plates 112. In this way, a maximum possible number of the storage devices can be installed. According to the present embodiment, each rack 140 can hold up to 24 storage devices or up to 10 kilograms.

A pivot structure 160 and a handle 170 for operating the rack 140 are disposed at one side of the rack 140 near the motherboard 120. By means of the pivot structure 160, the rack 140 is rotatable with respect to the server chassis 110. The system cooling module 200 is disposed in the accommodating space 116 and electrically connected to the motherboard 120. The system cooling module 200 is disposed adjacent to one side of the rack 140. A first cord passage 190 is provided between the rack 140 and each of the side plates 112. A second cord passage 192 is provided between the system cooling module 200 and each of the side plates 112. The storage devices disposed in the racks 140 are electrically connected to the motherboard 120 via the first cord passage 190 and the second cord passage 192.

Figure 3:
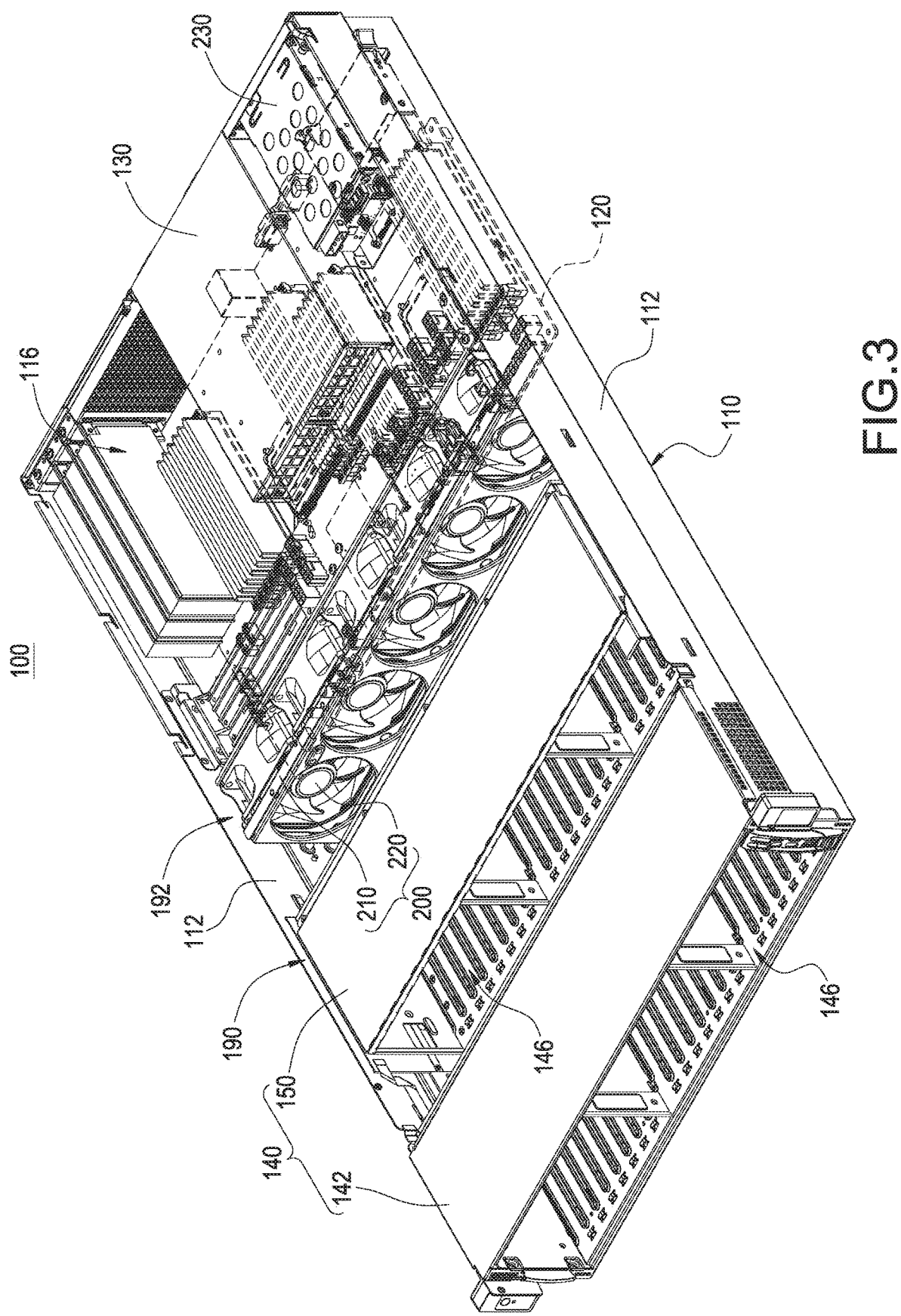
FIG. 3 is a schematic view of the present invention, showing the interior structure of the server capable of rotating and accessing the storage devices accommodated therein.

As shown in FIGS. 3 and 4, each of the first cord passages 190 and each of the second cord passages 192 defined by the side plate 112 at the same side are disposed correspondingly and communicate with each other. Therefore the storage devices accommodated in the rack 140 (i.e. the first supporting body 142) in the front end are electrically connected to the motherboard 120 via each of the first cord passages 190 and each of the second cord passages 192. The second cord passage 192 is used to receive power lines or signal lines of the storage devices of both of the racks 140, thereby achieving ideal and convenient wiring of the server 100.

As shown in FIGS. 4 and 5, the racks 140 are a first supporting body 142 and a second supporting body 150. The insertion spaces 146 of the first supporting body 142 are disposed toward the outside of the server chassis 110, and consequently users can pull out or replace and service the storage devices directly, so the pivot structure 160 is not required. The second supporting body 150 is disposed between the first supporting body 142 and the system cooling module 200, and it is not easy for the users to pull out or replace and service the storage devices, so that the pivot structure 160 preferably collaborates with the second supporting body 150.

In the present embodiment, it is preferable that the pivot structure 160 is separated from the second supporting body 150 and disposed on a bottom plate 114 of the server chassis 110. In other words, the pivot structure 160 is exposed and disposed outside of the second supporting body 150, so that higher torque and stronger supporting force are provided, and the second supporting body 150 is rotated, with respect to the server chassis 110, using the reaction force provided from the bottom plate 114. The handle 170 is disposed on a supporting plate 152 of the second supporting body 150.

Referring to FIGS. 6 to 11, the pivot structure 160 includes a hinge 162, a fixed bracket 164 and a movable bracket 166, wherein the fixed bracket 164 and the movable bracket 166 are connected to the hinge 162. The hinge 162 includes a torque generation assembly composed of, for example, an axial body, a torsion spring enclosing the axial body, and various washers. The hinge 162 is conventional technique, so the detailed structure thereof is not described herein for brevity. One end of the fixed bracket 164 is fixed to the bottom plate 114. The movable bracket 166 is rotatable with respect to the fixed bracket 164. The handle 170 made of iron, steel, or alloy thereof includes a main body 174, a pivot shaft 172 pivotally connected to the supporting plate 152, and an operating portion 176 and a hook portion 178 respectively disposed at two sides of the main body 174.

The pivot shaft 172 passes through the main body 174 and is connected to the movable bracket 166 and the supporting plate 152, so the operating portion 176 is rotatable about the pivot shaft 172 as center. The operating portion 176 is perpendicularly connected to one end of the main body 174 in a direction toward the supporting plate 152, thereby facilitating the user's operating and releasing the second supporting body 150. Furthermore, the pivot structure 160 further includes a bolt 168 protruding from one side of the fixed bracket 164, the hook portion 178 includes at one side an inclined surface 180 corresponding to the bolt 168, so the inclined surface 180 is slidable to engage the hook portion 178 with the bolt 168.

For operation safety and other purposes, the main body 174 further includes a hole 182 and a block plate 184 bent from the hole 182; the block plate 184 protrudes toward the supporting plate 152 to contact an edge of the movable bracket 166 so as to restrict a rotation angle of the operating portion 176. The movable bracket 166 includes a restriction plate 167 adjacent to the hinge 162, the restriction plate 167 is perpendicularly connected to the movable bracket 166 to obstruct the fixed bracket 164 to thereby restrict a rotation angle of the second supporting body 150.

Figure 8:
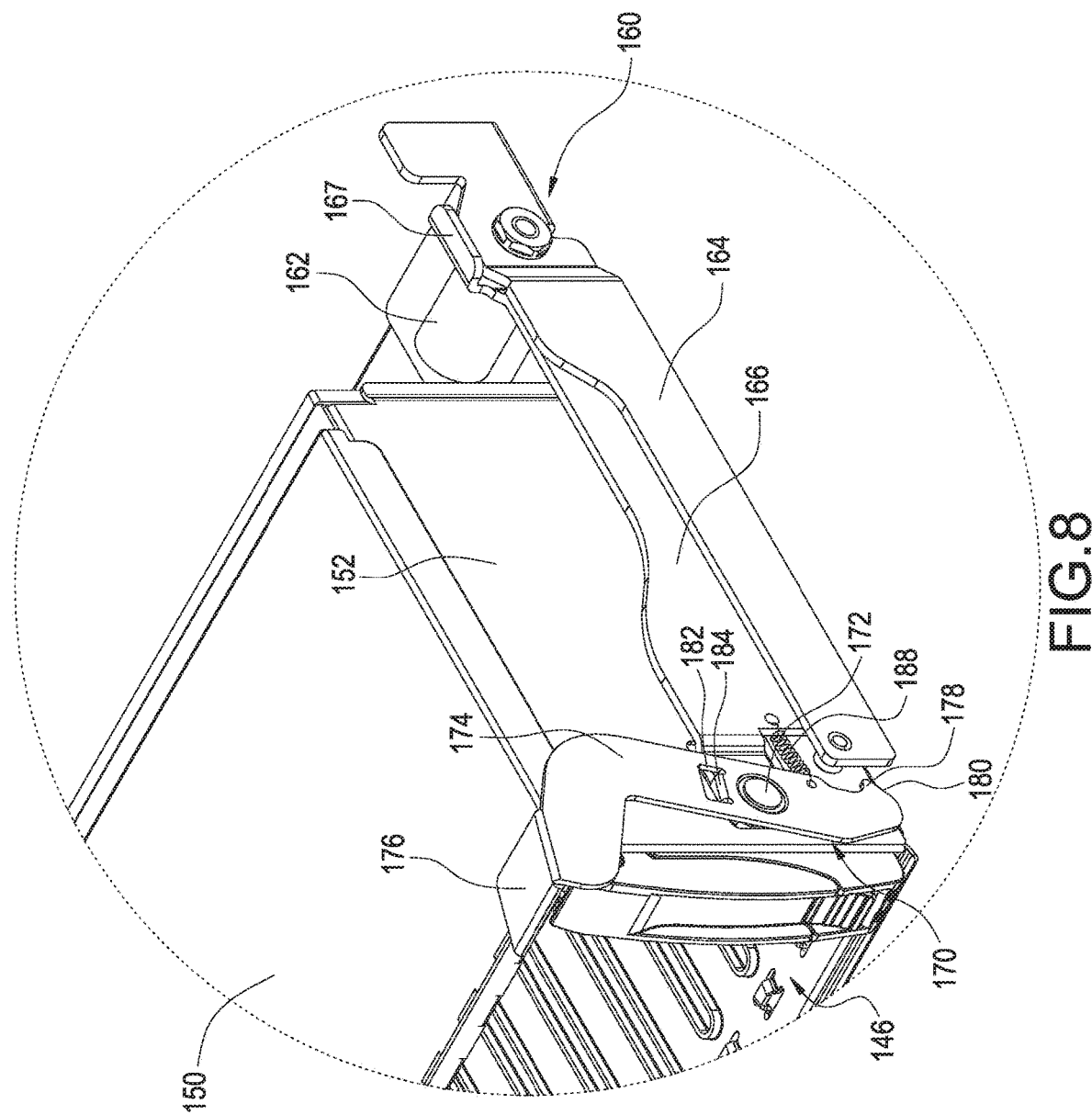
FIG. 8 is a perspective view of the present invention, illustrating operating the handle to release a second supporting body.
Figure 9:
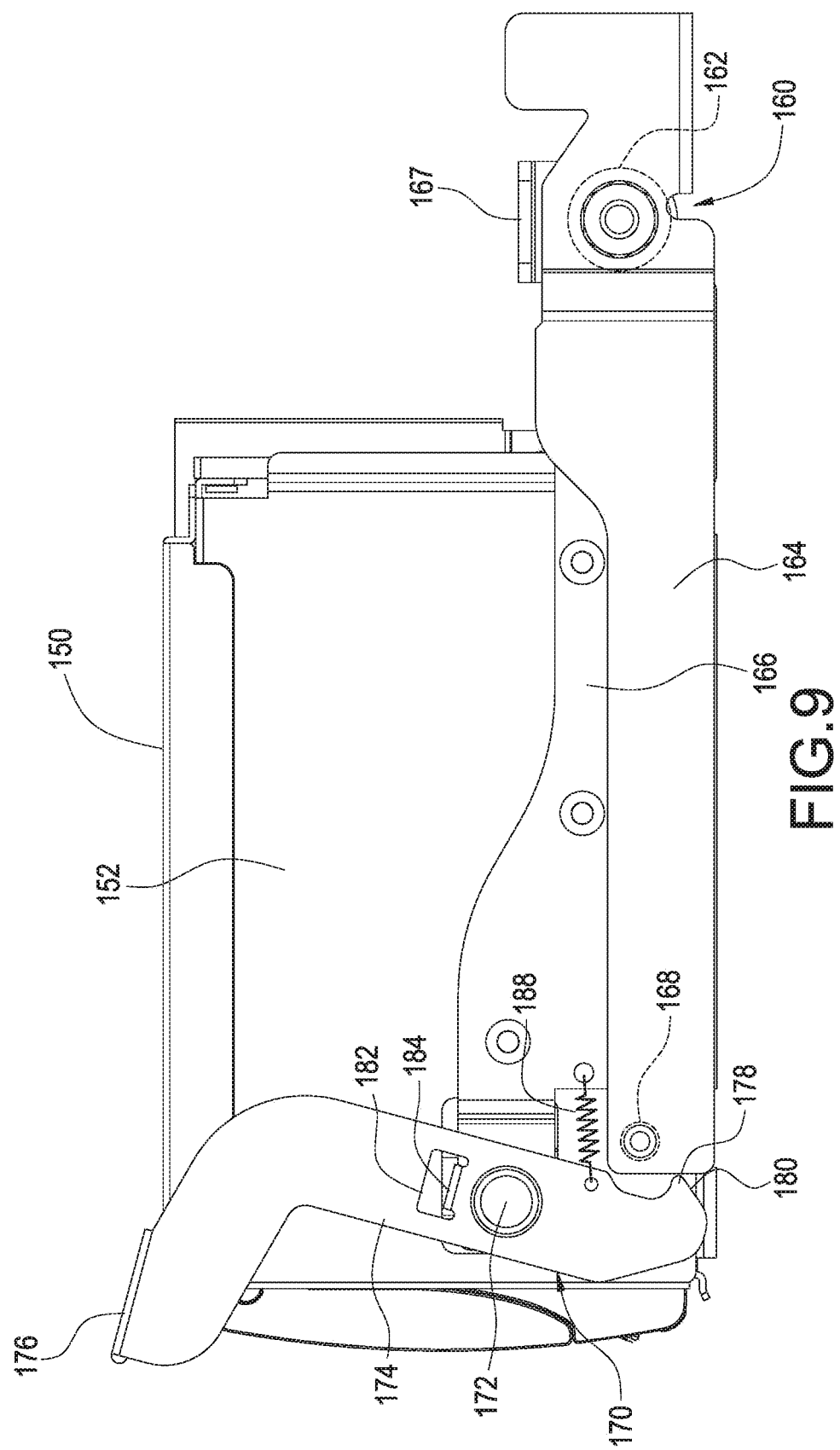
FIG. 9 is a side view of FIG. 8.
Figure 10:
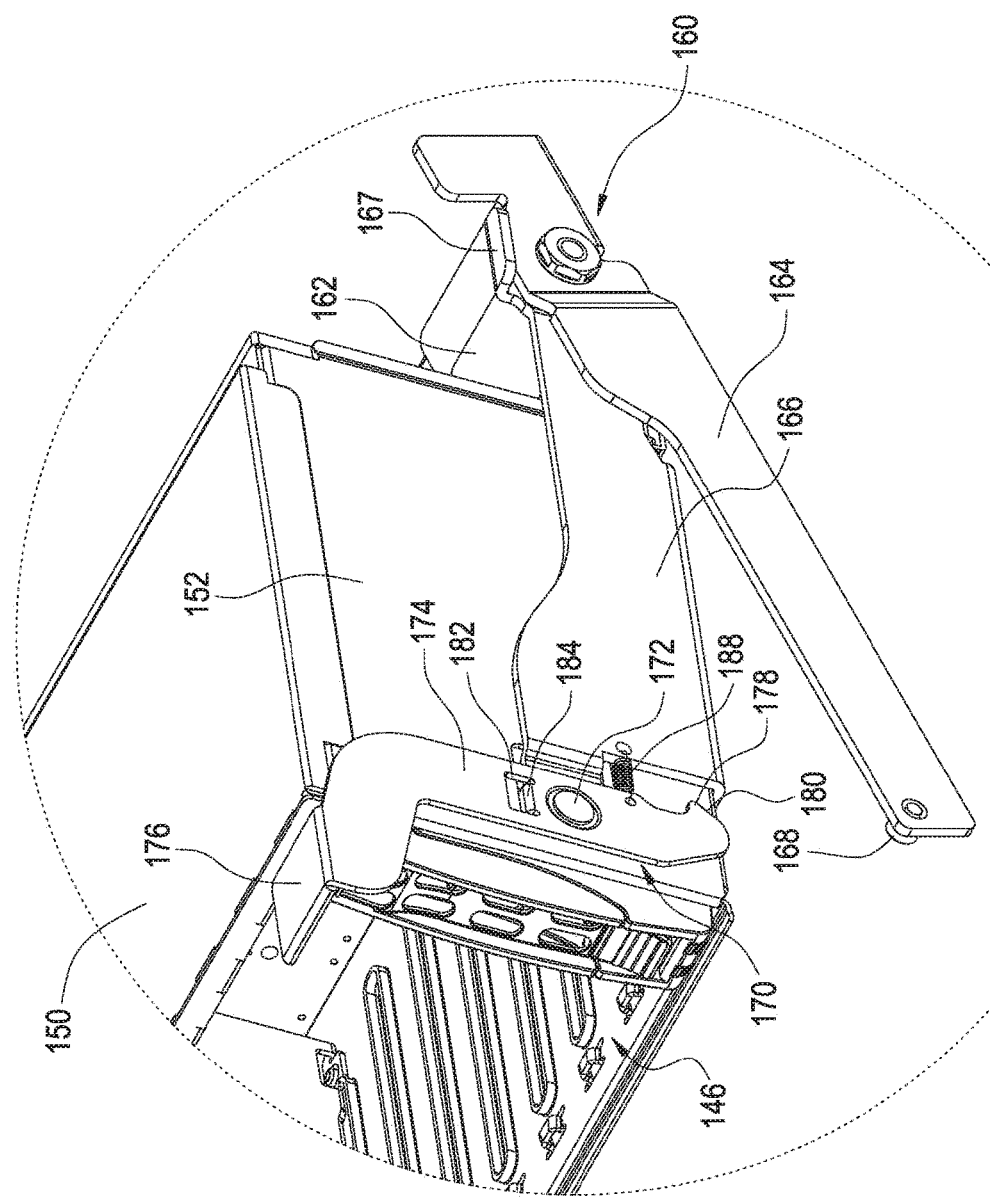
FIG. 10 is a perspective view of the present invention, illustrating that a movable bracket of the pivot structure rotates the second supporting body.
Figure 11:
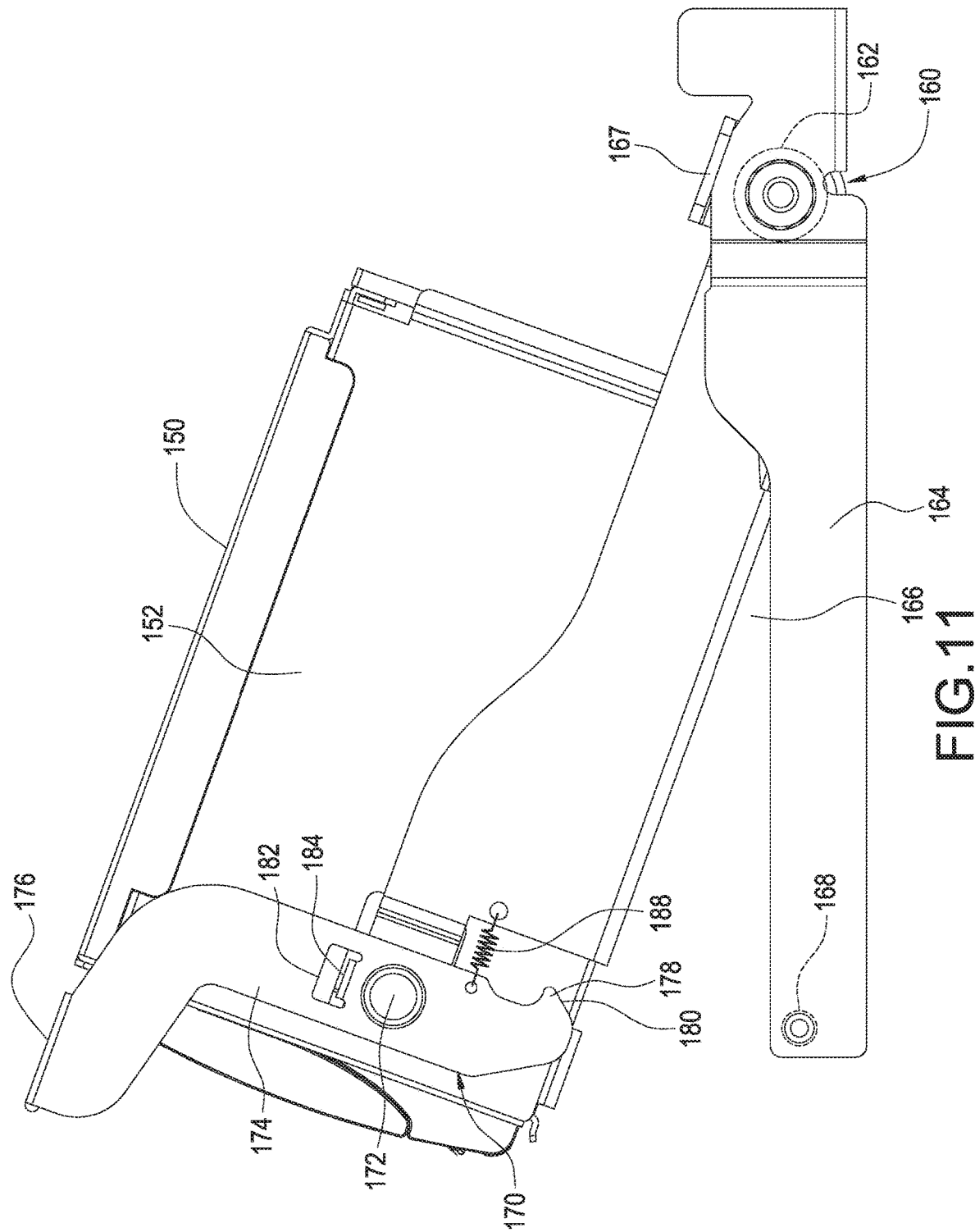
FIG. 11 is a side view of FIG. 10.

As shown in FIGS. 8 and 9, when operating the handle 170, the hook portion 178 is released from the restriction of the bolt 168. That is to say, when pulling up the operating portion 176, the hook portion 178 moves away from the bolt 168. At this point, as shown in FIGS. 10 and 11, the movable bracket 166 of the pivot structure 160 drives the second supporting body 150 to rotate away from the server chassis 110, and the rotation movement stops when the restriction plate 167 contacts an edge of the fixed bracket 164. At this moment, the user can pull out or replace and service the storage devices of the second supporting body 150, so maintenance or examination is very convenient.

Figure 6:
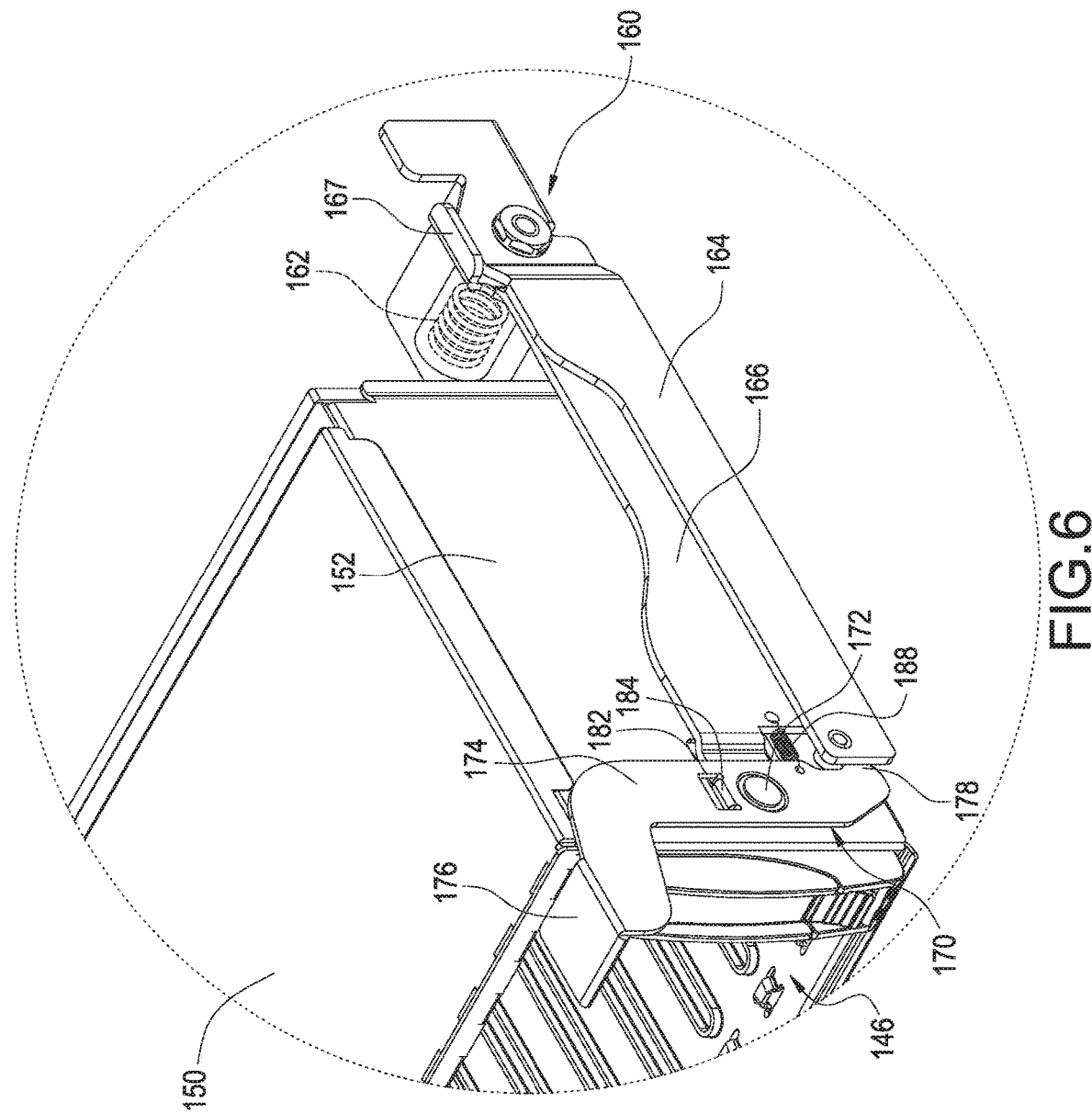
FIG. 6 is a partial enlarged view of FIG. 5, i.e. a perspective view illustrating a pivot structure and a handle according to the present invention.
Figure 7:
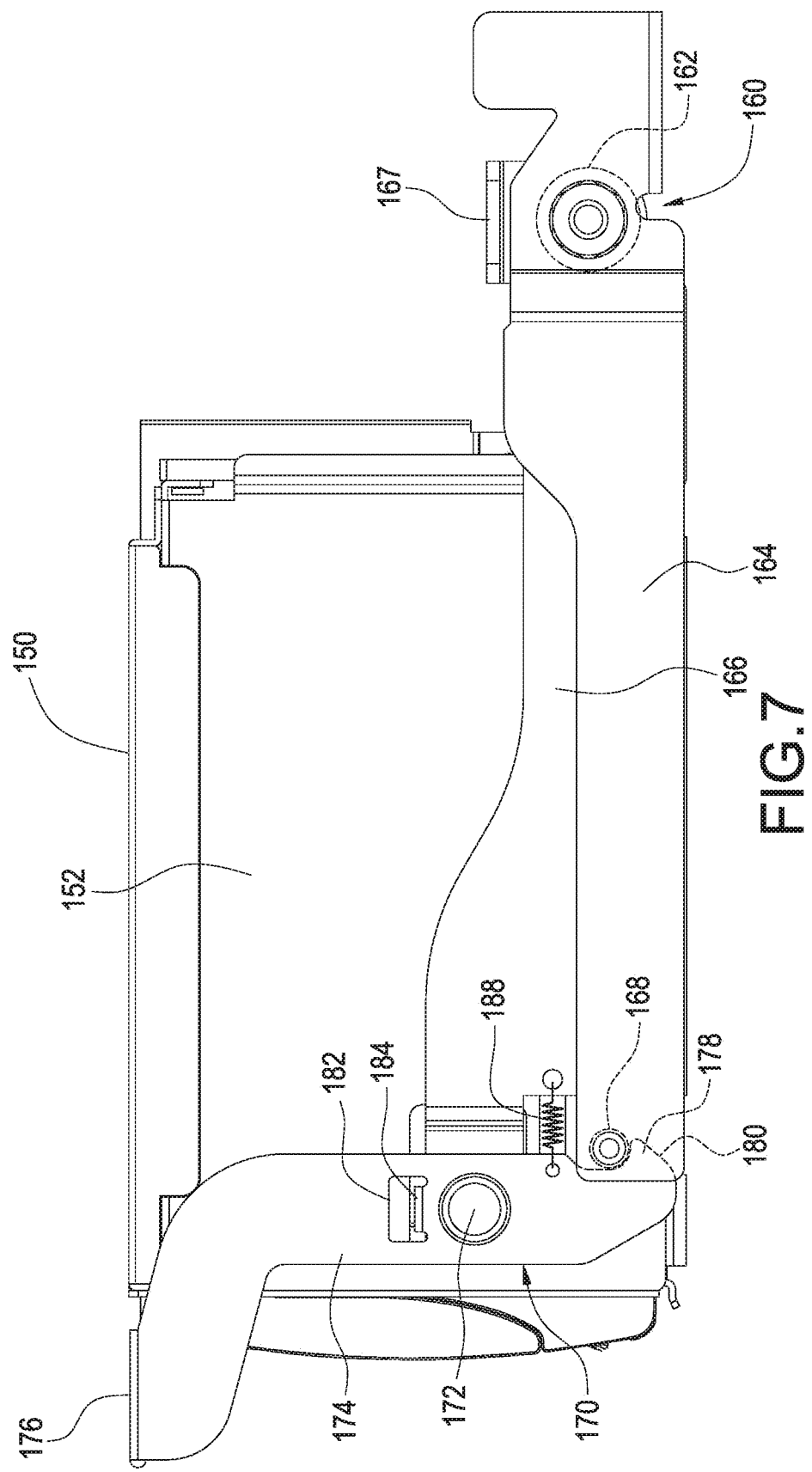
FIG. 7 is a side view of FIG. 6.

The present embodiment further includes a flexible element 188 for restoring the handle 170 to its original position, and two ends of the flexible elements are connected to the movable bracket 166 and the main body 174. The flexible element 188 is preferably a compression spring or other suitable spring. After pulling out or replacing the storage device, the user can press down the second supporting body 150 to position the second supporting body 150 in the chassis 110. During the pressing-down process, the inclined surface 180 of the handle 170 slidably contacts the bolt 168 until the hook portion 178 is engaged with the bolt 168 to position the second supporting body 150, as shown in FIGS. 6 and 7. Accordingly, by utilizing a single handle 170, the present invention can manipulate and position the second supporting body 150 more conveniently.

Figure 12:
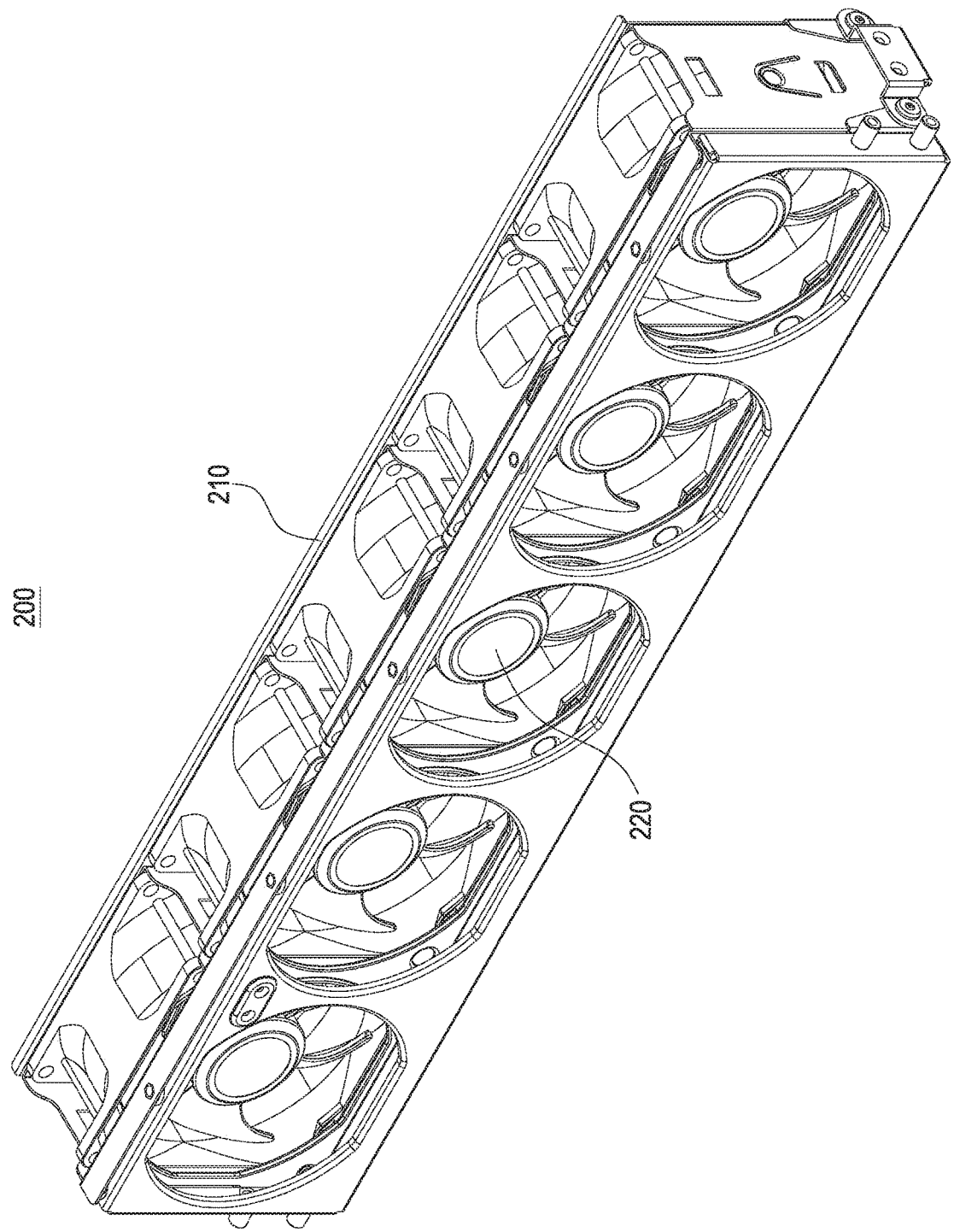
FIG. 12 is a perspective view of the present invention, illustrating a system cooling module.
Figure 13:
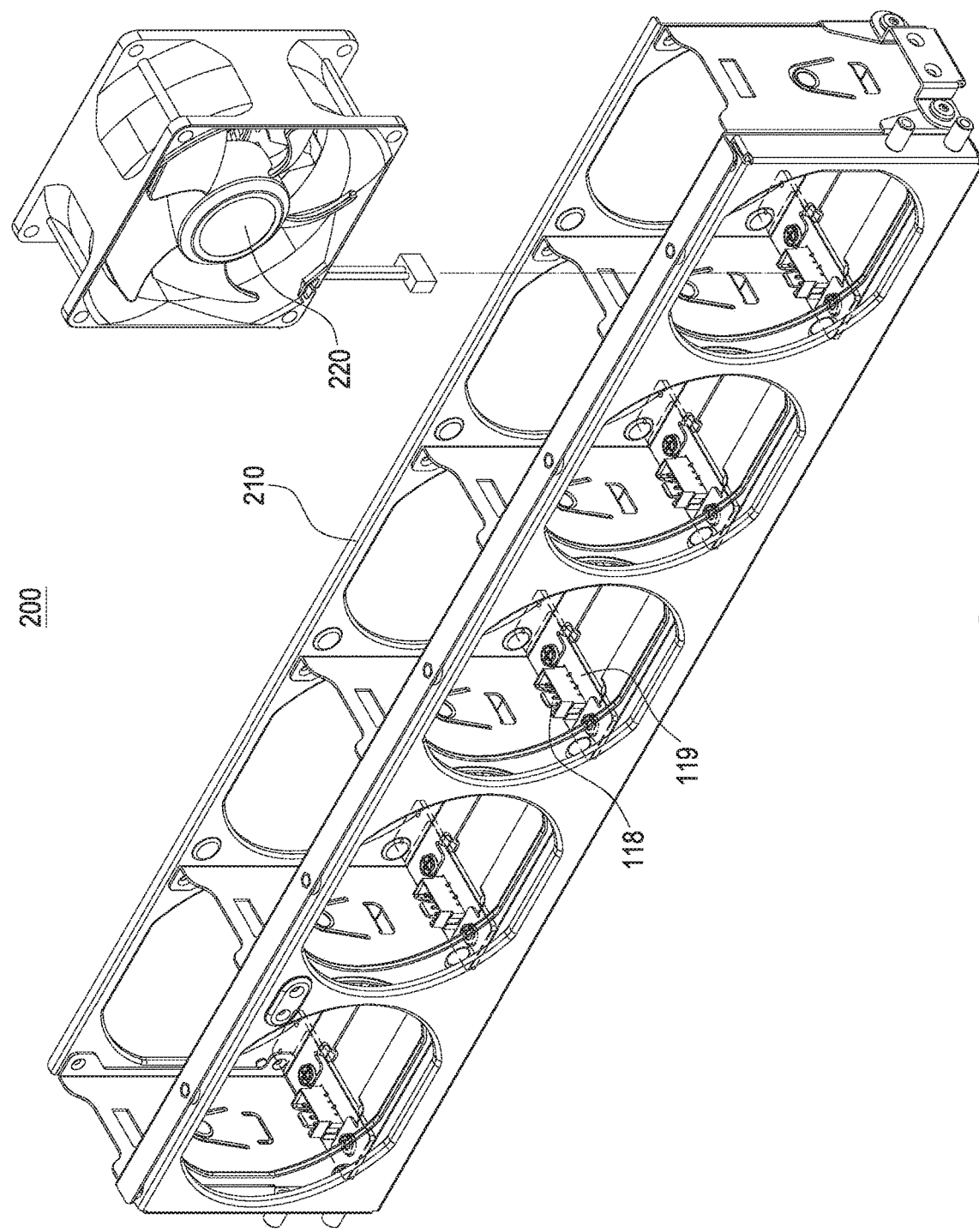
FIG. 13 is an exploded view of FIG. 12.

Referring to FIGS. 12 and 13, the system cooling module 200 further includes a fixed frame 210 and a plurality of fans 220 disposed in the fixed frame 210. A circuit board 119 having a plurality of connectors 118 is further disposed on the bottom plate 114 of the server chassis 110, and each of the connectors 118 is electrically connected to the motherboard 120. The fans 220 are vertically disposed along the direction of the fixed frame 210 and are connected to the respective connectors 118. Therefore, by using the system cooling module 200 of the present embodiment, assembly can be accomplished more easily and conveniently and, in addition to that, by means of the fans 220 disposed centralized in the center of the server chassis 110, the system airflow can be focused on the storage devices in each rack 140 to expel the heat generated from the storage devices, thereby effectively enhancing the heat dissipation. It is preferable that the diameter size of each fan 220 referred herein is 8 inches, and there are 5 or more fans in total.

It should be noted that, the first cord passage 190 is provided between the rack 140 and each of the side plates 112, and the second cord passage 192 is provided between the system cooling module 200 and each of the side plates 112, so the storage devices in the racks 140 are electrically connected to the motherboard 120 via the first and second cord passages 190 in a centralized manner, 192, thereby achieving ideal and convenient wiring of the server 100.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. A system, comprising:
    a server chassis;
    a first storage device rack detachably connected to the server chassis;
    a second storage device rack detachably connected to the server chassis and arranged parallel to the first storage device rack; and
    a pivot structure disposed on a first side of the second storage device rack, the pivot structure including:
        a fixed bracket, and
        a handle having a main body perpendicular to a horizontal edge of the fixed bracket,
        wherein the pivot structure allows the second storage device rack to rotate upward from the server chassis about a first axis, and
        wherein the handle is rotatable about a second axis that is different than the first axis.

2. The system of claim 1, wherein the server chassis includes two side plates and an accommodating space between the two side plates.

3. The system of claim 2, further comprising:
    a motherboard disposed in the accommodating space; and
    a system cooling module disposed in the accommodating space adjacent to a first side of the second storage device rack.

4. The system of claim 3, wherein the system cooling module includes:
    a fixed frame; and
    a plurality of fans disposed in the fixed frame.

5. The system of claim 4, wherein each fan included in the plurality of fans is vertically disposed along a first direction of the fixed frame and is connected to a respective connector included in a plurality of connectors.

6. The system of claim 2, further comprising:
    a first plurality of cord passages between the second storage device rack and each of the side plates;
    a second plurality of cord passages between the system cooling module and each of the side plates.

7. The system of claim 1, wherein the pivot structure further includes:
    a movable bracket;
    a hinge connected to the movable bracket and the fixed bracket.

8. The system of claim 1, wherein the handle further includes:
    a main body;
    a pivot shaft directly connected to the main body and pivotally connected to a supporting plate; and
    a hook portion disposed on a first side of the main body.

9. The system of claim 8, wherein the pivot structure further includes a bolt protruding from one side of the fixed bracket, and further wherein one side of the hook portion corresponding to the bolt is provided with an inclined surface that is slidable to engage the hook portion with the bolt.

10. The system of claim 8, wherein the main body further includes:
a hole; and
a block plate bent from the hole, the block plate protruding towards the supporting plate,
wherein the movable bracket includes a restriction plate adjacent to the hinge, and wherein the restriction plate is perpendicularly connected to the movable bracket to obstruct the fixed bracket, thereby restricting a rotation angle of the movable bracket.

11. The system of claim 8, wherein the pivot structures further includes:
a movable bracket;
a hinge connected to the movable bracket and the fixed bracket; and
a flexible element for restoring the handle to a resting position, wherein two ends of the flexible elements are connected to the movable bracket and the main body, respectively.

12. The system of claim 2, further comprising:
an opening communicating with the accommodating space; and
an electronic device disposed within the opening.

13. The system according to claim 12, wherein the server chassis further includes a partition plate that divides the accommodating space into a first layer and a second layer.

14. The system according to claim 13, wherein the electronic device and a power supply module are disposed in the first layer, and a motherboard is disposed in the second layer.

15. A system, comprising:
a server chassis;
a first storage device rack detachably connected to the server chassis;
a second storage device rack detachably connected to the server chassis and arranged parallel to the first storage device rack, the second storage rack including a plurality of supporting plates; and
a pivot structure disposed on a first side of the second storage device rack that allows the second storage device rack to rotate upward from the server chassis, the pivot structure including:
a fixed bracket;
a handle having:
a main body,
a pivot shaft directly connected to the main body and pivotally connected to a first supporting plate in the plurality of supporting plates, and
a hook portion disposed on a first side of the main body;
and
a bolt protruding from one side of the fixed bracket,
wherein one side of the hook portion corresponding to the bolt is provided with an inclined surface that is slidable to engage the hook portion with the bolt, and
wherein the handle is rotatable about the pivot shaft to release the hook portion from engagement with the bolt.

16. The system of claim 15, wherein the second storage rack device includes a plurality of insertion spaces, wherein a plurality of storage devices are vertically accommodated in the insertion space.

17. The system of claim 15, further comprising:
a motherboard disposed in an accommodating space of the server chassis, wherein the server chassis includes two side plates and the accommodating space is between the two side plates; and
a bottom plate that is connected to the plurality of supporting plates, wherein the bottom plate has a plurality of connectors that connect to the motherboard.

18. The system of claim 17, further comprising:
a first plurality of cord passages between the second storage device rack and each of the side plates;
a second plurality of cord passages between the system cooling module and each of the side plates.

19. The system of claim 15, the pivot structure further comprising:
a movable bracket;
a hinge connected to the movable bracket and the fixed bracket; and
a flexible element for restoring the handle to a resting position, wherein two ends of the flexible elements are connected to the movable bracket and the main body, respectively.

* * * * *

UNITED STATES PATENT AND TRADEMARK OFFICE
CERTIFICATE OF CORRECTION

PATENT NO. : 11,013,137 B2  
APPLICATION NO. : 15/960346  
DATED : May 18, 2021  
INVENTOR(S) : Richard S. Chen and Chaoching Wu Page 1 of 1

It is certified that error appears in the above-identified patent and that said Letters Patent is hereby corrected as shown below:

On the Title Page

Please insert:
--(30) Foreign Application Priority Data
May 22, 2014 (TW) ...................... 103208967--.

Signed and Sealed this  
Thirteenth Day of July, 2021

Drew Hirshfeld  
*Performing the Functions and Duties of the*  
*Under Secretary of Commerce for Intellectual Property and*  
*Director of the United States Patent and Trademark Office*